(12) United States Patent
Riho

(10) Patent No.: US 7,764,553 B2
(45) Date of Patent: Jul. 27, 2010

(54) SEMICONDUCTOR MEMORY DEVICE AND CONTROL METHOD THEREOF

(75) Inventor: Yoshiro Riho, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 28 days.

(21) Appl. No.: 12/318,254

(22) Filed: Dec. 23, 2008

(65) Prior Publication Data
US 2010/0110808 A1  May 6, 2010

(30) Foreign Application Priority Data
Oct. 30, 2008  (JP)  .............................. 2008-279549

(51) Int. Cl.
*G11C 5/14* (2006.01)
(52) U.S. Cl. ............................. 365/189.09; 365/185.09; 365/230.06
(58) Field of Classification Search ............ 365/189.09, 365/185.09, 230.06
See application file for complete search history.

(56) References Cited

U.S. PATENT DOCUMENTS 5,841,712 A * 11/1998 Wendell et al. ............. 365/200
5,841,727 A   11/1998 Iwanari et al.

FOREIGN PATENT DOCUMENTS

JP  9-320262  12/1997

* cited by examiner

*Primary Examiner*—Hoai V Ho
*Assistant Examiner*—Jason Lappas
(74) *Attorney, Agent, or Firm*—McGinn IP Law Group, PLLC

(57) ABSTRACT

A semiconductor memory device according to the present invention includes: a memory cell array having a normal memory cell and a redundant memory cell that is used to replace the normal memory cell when it is defective; a word driver selecting a predetermined word line within the memory cell array based on a row address supplied in synchronism with an active command, and canceling selection of the word line in response to a precharge command; and a signal control circuit resetting a repair address generated when the row address indicates the normal memory cell that is defective, without resetting a predecode signal generated by predecoding the row address, in response to issuance of the precharge command.

8 Claims, 18 Drawing Sheets

SEMICONDUCTOR MEMORY DEVICE AND CONTROL METHOD THEREOF

BACKGROUND OF THE INVENTION

1. Field of the Invention

The present invention relates to a semiconductor memory device and a control method thereof, and, more particularly relates to a semiconductor memory device having a redundant memory cell that replaces a defective normal memory cell, and a control method thereof.

2. Description of Related Art

DRAM (Dynamic Random Access Memory) is one of the most widely used semiconductor memory devices. In recent years, most of the used DRAMs are predominated by a synchronous DRAM in which a command is inputted in synchronism with a clock signal and data is inputted and outputted. Issuance of a command to the synchronous DRAM is performed as described below.

First, when performing a read operation, a row address is inputted in synchronism with an active command (ACT), and subsequently a column address is inputted in synchronism with a read command (READ). Thereby, read data is outputted from a data input/output pin. Meanwhile, when performing a write operation, the row address is inputted in synchronism with the active command (ACT), and subsequently a column address is inputted in synchronism with a write command (WRIT). Thereby, write data inputted to the data input/output pin is written. At the last stage of the read operation and the write operation, a precharge command (PRE) is inputted, and thereby a word line is reset.

The active command (ACT) selects the word line of a memory cell, which is an access target. The row address inputted in synchronism with the active command (ACT) is predecoded by a predecoder, and a predecode signal generated thereby is supplied to a driver circuit that drives the word line. In Japanese Patent Application Laid-open No. H9-320262, there is disclosed an example in which a holding circuit that holds a predecode signal is arranged for each memory cell.

Generally, the predecode signal is reset in response to issuance of the precharge command (PRE). It is for transitioning the predecode signal at a higher speed when the row address is inputted in synchronism with a subsequent active command (ACT). That is, when the predecode signal maintains its logical level corresponding to the active command (ACT) of last time, a rate of change of predecode signal is decreased due to the influence of coupling between signal wirings. On the other hand, when the predecode signal is once reset, the influence of the coupling is eliminated and the rate of change of predecode signal is accelerated.

However, when the predecode signal is reset, charges on the signal wirings are all flown out. Thus, when the predecode signal is reset at each time the precharge command (PRE) is issued, there is a problem of power consumption increase. Accordingly, a method for preventing an increase in power consumption resulting from resetting of a predecode signal while suppressing the decrease in access rate as small as possible has been desired.

SUMMARY

The present invention seeks to solve one or more of the above problems, or to improve upon those problems at least in part.

In one embodiment, there is provided a semiconductor memory device that includes a memory cell array having a normal memory cell and a redundant memory cell that replaces the normal memory cell when it is defective, selecting a predetermined word line within the memory cell array based on a row address supplied in synchronism with an active command, and canceling selection of the word line in response to a precharge command, the semiconductor memory device includes: a predecoder generating a predecode signal by predecoding the row address; a repair determining circuit determining whether the row address is a defective address; a repair address decoder generating a repair address, upon being determined by the repair determining circuit that the row address is a defective address; a word driver selecting a word line corresponding to the normal memory cell based on the predecode signal, upon being determined by the repair determining circuit that the row address is not a defective address, and selects a word line corresponding to the redundant memory cell based on the repair address, upon being determined by the repair determining circuit that the row address is a defective address; and a signal control circuit resetting the repair address without resetting the predecode signal, in response to issuance of the precharge command.

In another embodiment, there is provided a control method of a semiconductor memory device, that includes a memory cell array having a normal memory cell and a redundant memory cell that replaces the normal memory cell when it is defective, selecting a predetermined word line within the memory cell array based on a row address supplied in synchronism with an active command, and canceling selection of the word line in response to a precharge command, the control method of the semiconductor memory device includes: a predecode-signal generating step of generating a predecode signal by predecoding the row address; determining step of determining whether the row address is a defective address; repair-address generating step of generating a repair address, upon being determined at the determining step that the row address is a defective address; a word-line selecting step of selecting a word line corresponding to the normal memory cell based on the predecode signal, upon being determined at the determining step that the row address is not a defective address, and selecting a word line corresponding to the redundant memory cell based on the repair address, upon being determined at the determining step that the row address is a defective address; and an address resetting step of resetting the repair address without resetting the predecode signal, in response to issuance of the precharge command.

As described above, according to the present invention, when the precharge command is issued, the repair address is reset while the predecode signal is not reset. Thereby, an increase in power consumption resulting from resetting of the predecode signal is prevented. Further, the repair address is reset in response to the precharge command, and thus a high-speed access is maintained for a redundant path that rate-controls a row system access. That is, by utilizing a rate difference between a regular path and a redundant path, a decrease in rate of the regular path resulting from not resetting the predecode signal is appropriated in a period that is originally intended to be a waiting time of the regular path. Thus, the decrease in rate of the regular path is partially or entirely masked by the redundant path that rate-controls the row system access.

BRIEF DESCRIPTION OF THE DRAWINGS

The above features and advantages of the present invention will be more apparent from the following description of certain preferred embodiments taken in conjunction with the accompanying drawings, in which:

FIG. 3 is a circuit diagram of the row predecoder 100;

DETAILED DESCRIPTION OF THE EMBODIMENTS

Preferred embodiments of the present invention will be explained below in detail with reference to the accompanying drawings.

Figure 1:
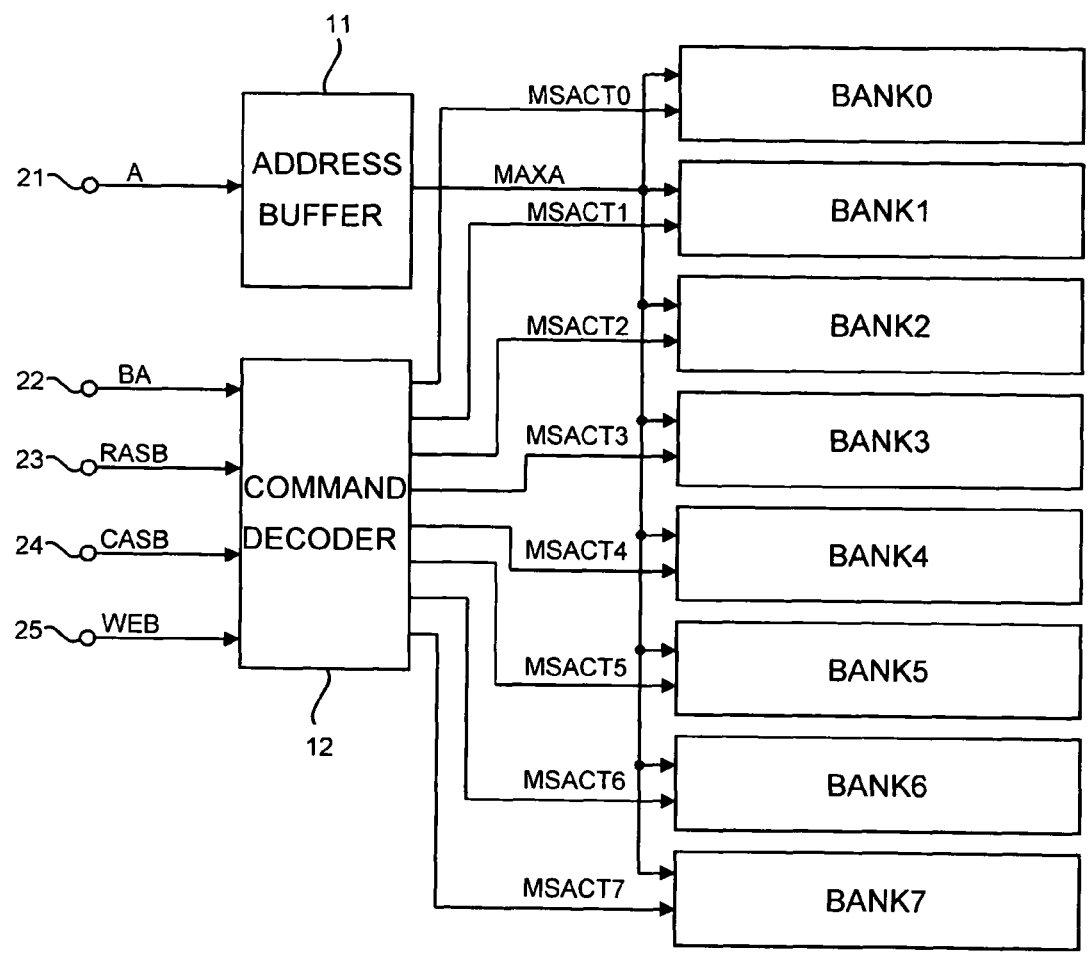
FIG. 1 is a block diagram showing an entire configuration of a semiconductor memory device according to an embodiment of the present invention.

FIG. 1 is a block diagram showing an entire configuration of a semiconductor memory device 10 according to an embodiment of the present invention.

Although not particularly limited, the semiconductor memory device 10 according to the present embodiment is a DRAM (Dynamic Random Access Memory). The DRAM includes a row system circuit that performs an access operation based on a row address and a column system circuit that performs an access operation based on a column address. In FIG. 1, out of the both circuits, only the row system circuit related to the present invention is shown.

As shown in FIG. 1, the semiconductor memory device 10 includes eight banks, BANK0 to BANK7. These banks are units each operable by individual commands. In the present invention, it is not essential that the number of banks is eight. It is not essential either that the banks are divided into a plural number.

The semiconductor memory device 10 includes an address buffer 11 and a command decoder 12. The address buffer 11 is supplied with an address signal A via an address terminal 21. Although not particularly limited, the address signal A inputted to the address buffer 11 is directly outputted as an internal address MAXA, and supplied commonly to each bank BANK0 to BANK7.

The command decoder 12 is supplied with a bank address signal BA, an RASB signal (row address strobe signal), a CASB signal (column address strobe signal), and a WEB signal (write enable signal), respectively, via a bank address terminal 22, and command terminals 23 to 25. The command decoder 12 generates various types of internal commands based on the combination of logical levels of the RASB signal, the CASB signal, and the WEB signal. In FIG. 1, among these commands, internal commands MSACT0 to MSACT7 are shown. The command decoder 12 sets the internal commands MSACT0 to MSACT7 corresponding to the bank address signal BA to a high level when the combination of logical levels of the RASB signal, the CASB signal, and the WEB signal indicates an "active command (ACT)", and sets the internal commands MSACT0 to MSACT7 corresponding to the bank address signal BA to a low level when the combination of logical levels of the RASB signal, the CASB signal, and the WEB signal indicates a "precharge command (PRE)". As shown in FIG. 1, the internal commands MSACT0 to MSACT7 are each supplied to the corresponding banks BANK0 to BANK7.

The semiconductor memory device 10 includes a clock input terminal, a data input/output terminal, a power supply terminal or the like as other external terminals. However, these components are not shown in FIG. 1.

Figure 2:
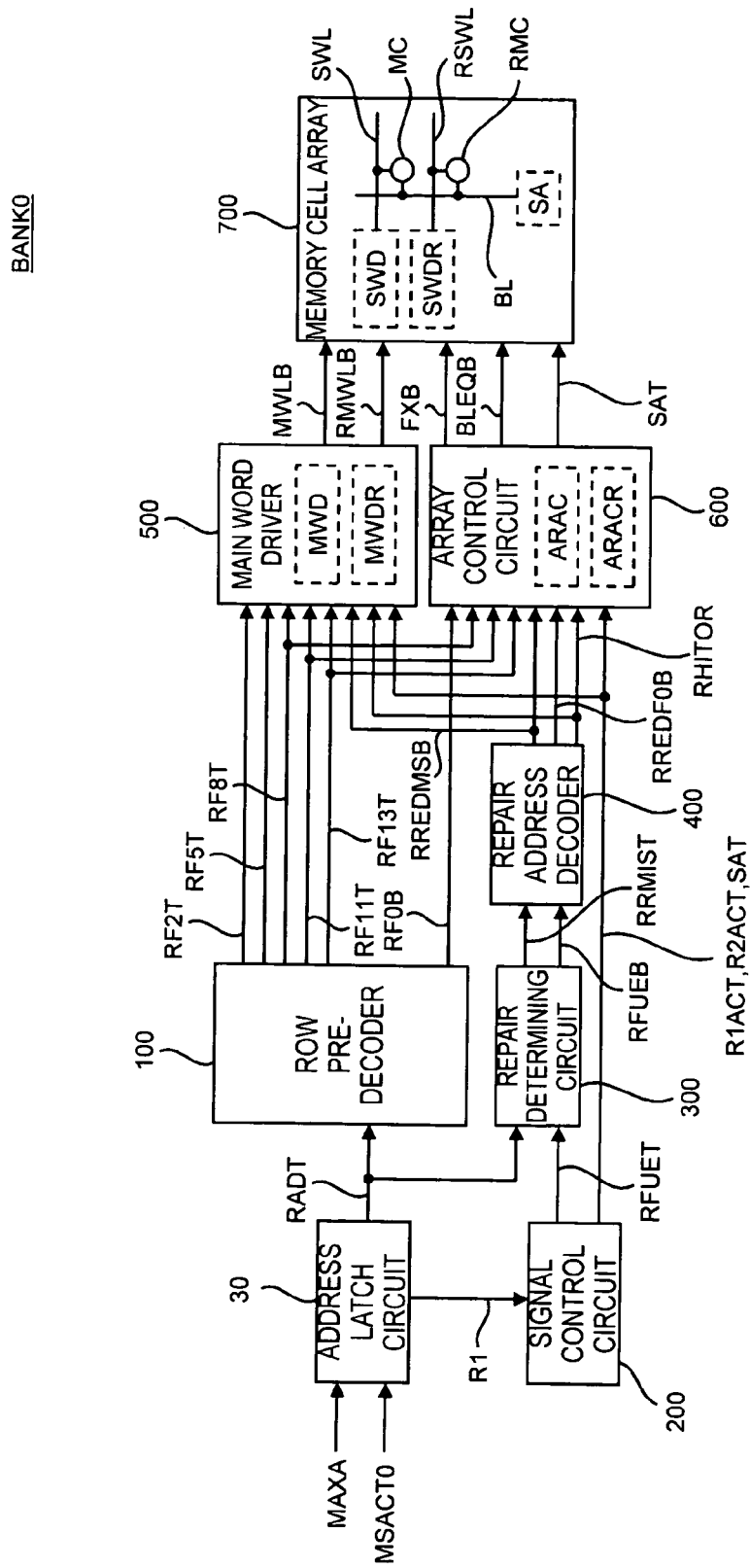
FIG. 2 is a block diagram showing a circuit configuration of the BANK0.

FIG. 2 is a block diagram showing a circuit configuration of the BANK0. The other banks BANK1 to BANK7 also have a circuit configuration similar to that of the BANK0 shown in FIG. 2.

As shown in FIG. 2, the internal address MAXA and the internal command MSACT0 are supplied to an address latch circuit 30. Out of the internal address MAXA fetched to the address latch circuit 30, the row address RADT is supplied to a row predecoder 100. Although not particularly limited, the row address RADT is a 14-bit signal.

Figure 3:
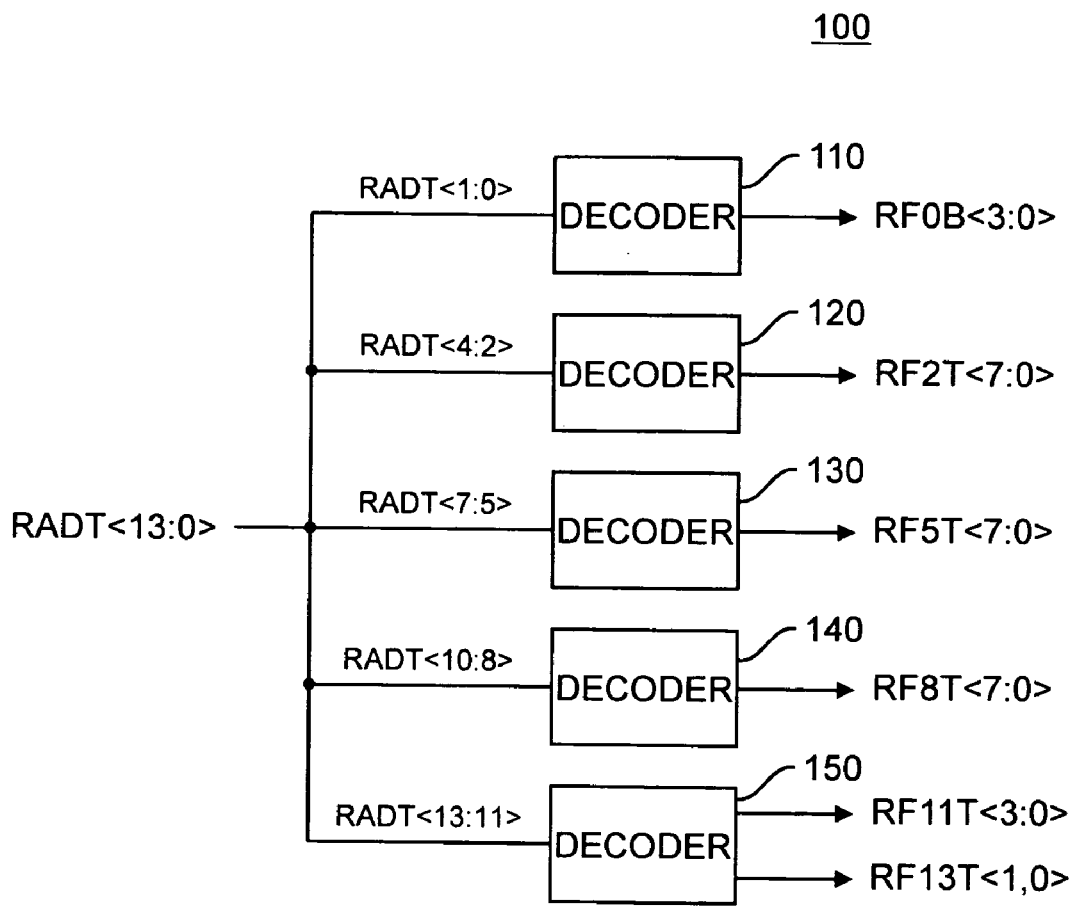
FIG. 3 is

FIG. 3 is a circuit diagram of the row predecoder 100.

As shown in FIG. 3, the row predecoder 100 is configured by five decoders 110, 120, 130, 140, and 150. The row address RADT predecoded by the row predecoder 100 is a 14-bit signal, and is written as RADT<13:0> in FIG. 3. This means that the row address RADT is a 14-bit signal constituted by RADT<13> to RADT<0>.

The five decoders 110, 120, 130, 140, and 150 configuring the row predecoder 100 decode a 2-bit RADT<1:0>, a 3-bit RADT<4:2>, a 3-bit RADT<7:5>, a 3-bit RADT<10:8>, and a 3-bit RADT<13:11> of the row address, respectively. Thereby, the decoder 110 generates a 4-bit predecode signal RF0B<3:0>, the decoder 120 generates an 8-bit predecode signal RF2T<7:0>, the decoder 130 generates an 8-bit predecode signal RF5T<7:0>, the decoder 140 generates an 8-bit predecode signal RF8T<7:0>, and the decoder 150 generates a 4-bit predecode signal RF11T<3:0> and a 2-bit predecode signal RF13T<1:0>.

As shown in FIG. 3, the decoders 110, 120, 130, 140, and 150 configuring the row predecoder 100 are not supplied with a signal for resetting the predecode signal which is output. This means that when the logical level of the predecode signal is finalized as a result of the row address. RADT being inputted, the logical level of the predecode signal is held until the row address RADT is changed next.

These predecode signals are supplied to a main word driver 500 and an array control circuit 600, as shown in FIG. 2. Although the detail is described later, the main word driver 500 includes two types of main word drivers MWD and MWDR, and the array control circuit 600 includes two types of control circuits ARAC and ARACR. The main word driver MWD and the control circuit ARAC are circuits for accessing a normal memory cell MC, and the main word driver MWDR and the control circuit ARACR are circuits for accessing a normal memory cell MC or a redundant memory cell RMC.

On the other hand, the address latch circuit 30 synchronizes with an output timing of the row address RADT to generate a timing signal R1. The timing signal R1 is supplied to a signal control circuit 200 shown in FIG. 2.

Figure 4:
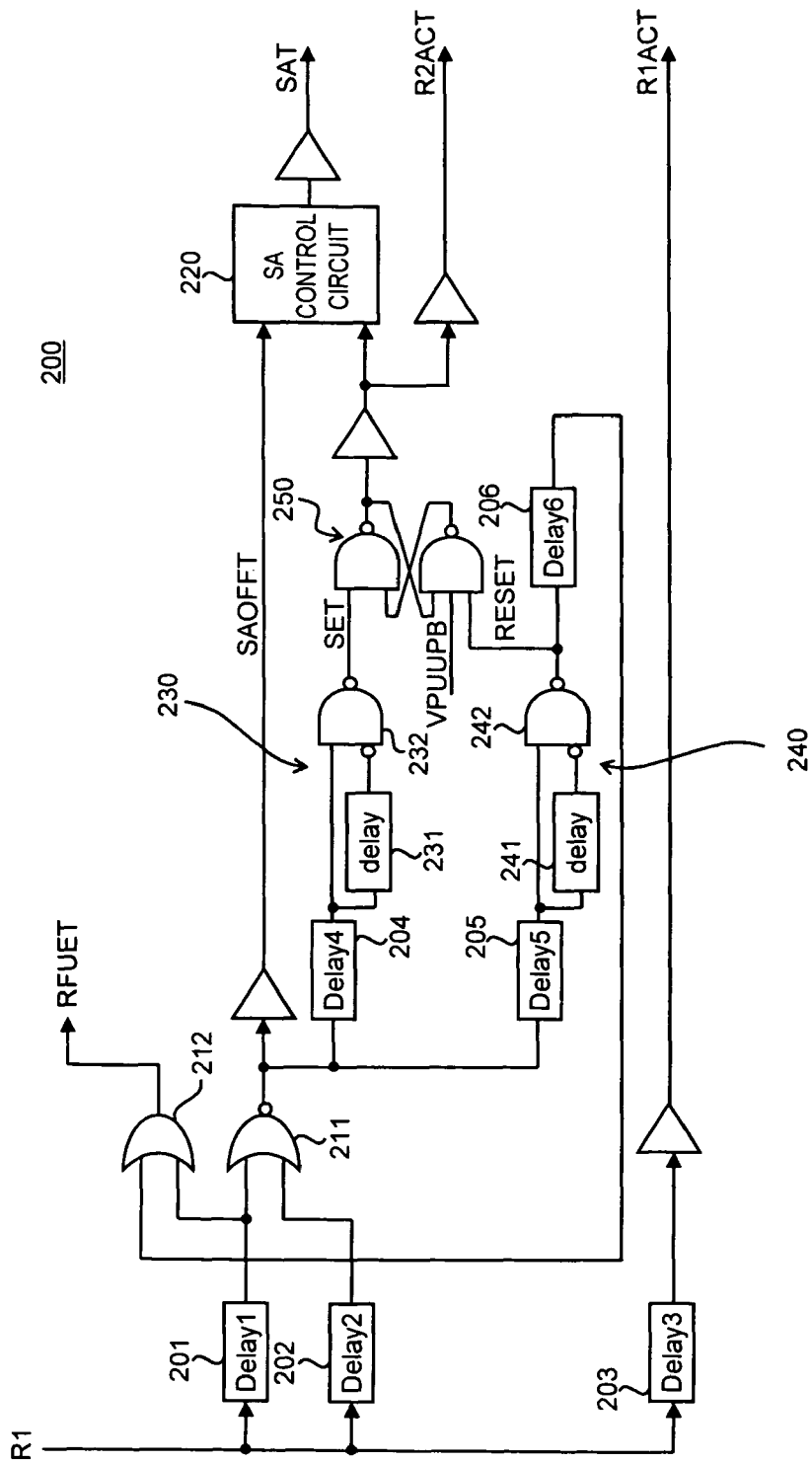
FIG. 4 is a circuit diagram of the signal control circuit 200.

FIG. 4 is a circuit diagram of the signal control circuit 200.

As shown in FIG. 4, the signal control circuit 200 includes delay circuits 201 to 203 that delay the timing signal R1. Output of the delay circuit 203 is outputted as a timing signal R1ACT, and supplied to the array control circuit 600 as shown in FIG. 2. On the other hand, outputs of the delay circuits 201 and 202 are supplied to an NOR circuit 211. Output of the NOR circuit 211 is supplied to a sense-amplifier control circuit 220 as a sense stop signal SAOFFT, and also supplied to the delay circuits 204 and 205.

Output of the delay circuit 204 is supplied to a pulse generating circuit 230 constituted by the delay circuit 231 and the NAND circuit 232. Output of the pulse generating circuit 230 is supplied to a flip-flop circuit 250 so that the flip-flop circuit 250 is changed to a set state. On the other hand, output of the delay circuit 205 is supplied to a pulse generating circuit 240 constituted by a delay circuit 241 and a NAND circuit 242. Output of the pulse generating circuit 240 is supplied to the flip-flop circuit 250 so that the flip-flop circuit 250 is changed to a reset state.

Output of the flip-flop circuit 250 is supplied to the sense-amplifier control circuit 220, and also outputted as a timing signal R2ACT. The timing signal R2ACT is supplied to the array control circuit 600 shown in FIG. 2. The sense-amplifier control circuit 220 activates a sense-amplifier operation signal SAT in response to the output of the flip-flop circuit 250, and also inactivates the sense-amplifier operation signal SAT in response to the sense stop signal SAOFFT. As described later, the sense-amplifier operation signal SAT includes timing signals SAP1T, SAP2T, and SAN.

The output of the pulse generating circuit 240 is supplied also to the delay circuit 206. Outputs of the delay circuits 201 and 206 are supplied to an OR circuit 212. Output of the OR circuit 212 is supplied, as a fuse enable signal RFUET, to a repair determining circuit 300 shown in FIG. 2. The fuse enable signal RFUET is activated upon issuance of the active command (ACT), and inactivated upon issuance of the precharge command (PRE). Accordingly, the repair determining circuit 300 is in an inactivated state upon issuance of the precharge command (PRE), and the output is reset. On the other hand, as shown in FIG. 2, the fuse enable signal RFUET is not supplied to the row predecoder 100, and accordingly, the row predecoder 100 is not in an inactivated state even when the precharge command (PRE) is issued, and the output is not reset. When the predecode signal is reset, the charges on signal wirings are all flown out, and thus power consumption is increased. However, in the present embodiment, the increase in power consumption resulting from the resetting of the predecode signal does not occur.

Figure 5:
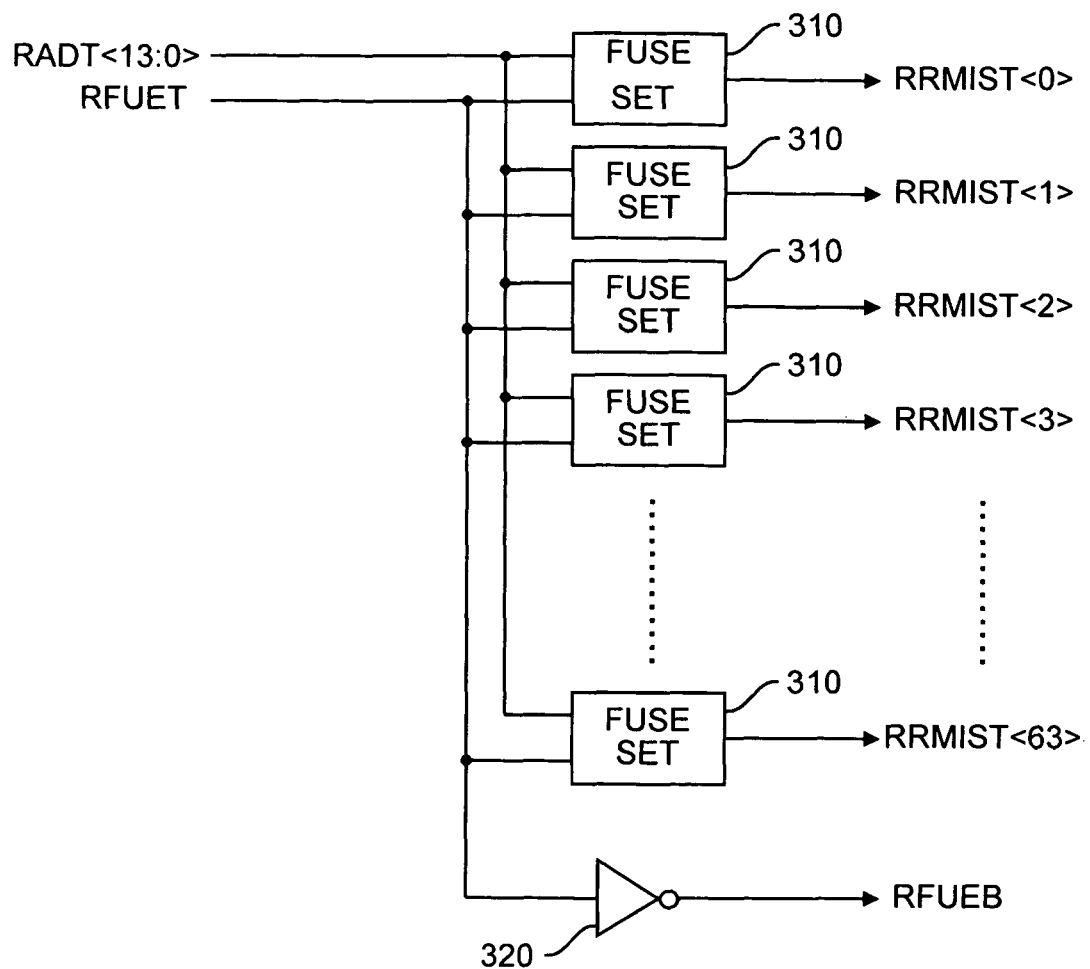
FIG. 5 is a circuit diagram of the repair determining circuit 300.

FIG. 5 is a circuit diagram of the repair determining circuit 300.

As shown in FIG. 5, the repair determining circuit 300 includes a plurality (64 in this embodiment) of fuse sets 310. The fuse sets 310 each store therein a defective address, that is, an address of a normal memory cell to be replaced in a non-volatile manner. The types of devices that store therein with the address are not particularly limited. A fuse device cuttable by laser beam or a large current, and an anti-fuse device capable of transitioning from a non-conductive state to a conductive state by insulation breakdown may be included.

Each fuse set 310 is supplied with the row address RADT and the fuse enable signal RFUET, and in response to activation of the fuse enable signal RFUET, compares the supplied row address RADT with the stored defective address. When the both addresses do not match as a result of the comparison (in a case of mishit), a corresponding mishit signal RRMIST is activated to a high level. On the other hand, when the both addresses match (in a case of hit), the corresponding mishit signal RRMIST is set to a low level. The mishit signal RRMIST is supplied to the repair address decoder 400 shown in FIG. 2.

The fuse enable signal RFUET supplied to the repair determining circuit 300 is inverted by an inverter 320. The inverted fuse enable signal RFUEB is supplied to the repair address decoder 400.

Figure 6:
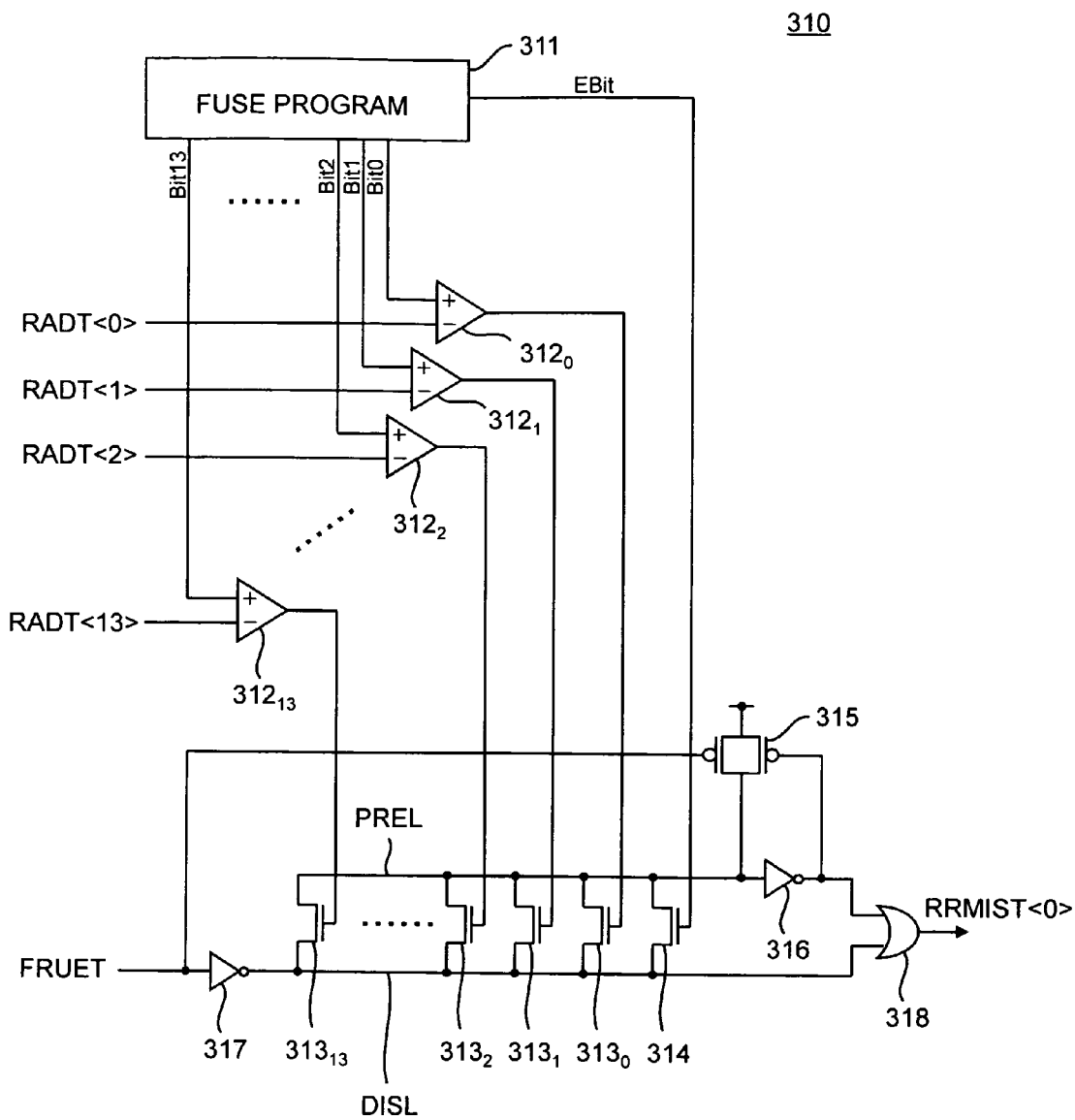
FIG. 6 is a circuit diagram of the fuse set 310.

FIG. 6 is a circuit diagram of the fuse set 310.

As shown in FIG. 6, the fuse set 310 includes a fuse program 311 that outputs determining bits Bit0 to Bit13 each corresponding to an enable bit EBit and a row address RADT<13:0>. The enable bit EBit is a signal fixed to a low level when the fuse set 310 is in a used state. The determining bits Bit0 to Bit13 are each supplied to corresponding comparators $312_0$ to $312_{13}$, and are thereby compared with the corresponding row address RADT<13:0>. When the both addresses match as a result of the comparison, output of each of the comparators $312_0$ to $312_{13}$ is transformed to a low level. When the addresses are mismatched, the output is held at a high level.

The outputs of the comparators $312_0$ to $312_{13}$ are each supplied to gates of the transistors $313_0$ to $313_{13}$. The enable bit EBit is supplied to the gate of the transistor 314. The transistors $313_0$ to $313_{13}$ and the transistor 314 are connected in parallel between a precharge line PREL and a discharge line DISL. The precharge line PREL is precharged by the precharge transistor 315 when the fuse enable signal RFUET is at a low level (an inactivated state). The precharge state of the precharge line PREL is maintained by feedback by the inverter 316. On the other hand, the discharge line DISL is set to a high level (a discharge disabled state) by the inverter 317 when the fuse enable signal RFUET is at a low level (an inactivated state), and set to a low level (a discharge permitted state) by the inverter 317 when the fuse enable signal RFUET is at a high level (an activated state).

The level of the precharge line PREL via the inverter 316 and that of the discharge line DISL via the same are supplied to the OR circuit 318, and the output is used as a mishit signal RRMIST<0>.

The fuse set 310 having such a configuration performs the following operation. First, in a period during which the fuse enable signal RFUET is at a low level (an inactivated state), the fuse set 310 precharges the precharge line PREL. Next, when the fuse enable signal RFUET is changed to a high level (an activated state), the fuse set 310 performs discharge of the discharge line DISL. However, as described above, the precharge line PREL is maintained at a precharge state by the feedback of the inverter 316.

When the outputs of the comparators $312_0$ to $312_{13}$ and the enable bit EBit are all at a low level in this state, the transistors $313_0$ to $313_{13}$ and the transistor 314 are all in an off state. Thus, a current path from the precharge line PREL to the discharge line DISL is not formed. That is, in this case, the precharge line PREL is maintained at a precharge state, and as a result, the mishit signal RRMIST<0> is set to a low level.

In contrast, when any one of the outputs of the comparators $312_0$ to $312_{13}$ and the enable bit EBit is at a high level, at least one of the transistors $313_0$ to $313_{13}$ and the transistor 314 is turned on. Thus, the current path from the precharge line PREL to the discharge line DISL is formed. That is, in this case, the precharge line PREL is discharged, and as a result, the mishit signal RRMIST<0> is set to a high level.

In this way, the 64 fuse sets 310 each generate the mishit signal RRMIST.

Figure 7:
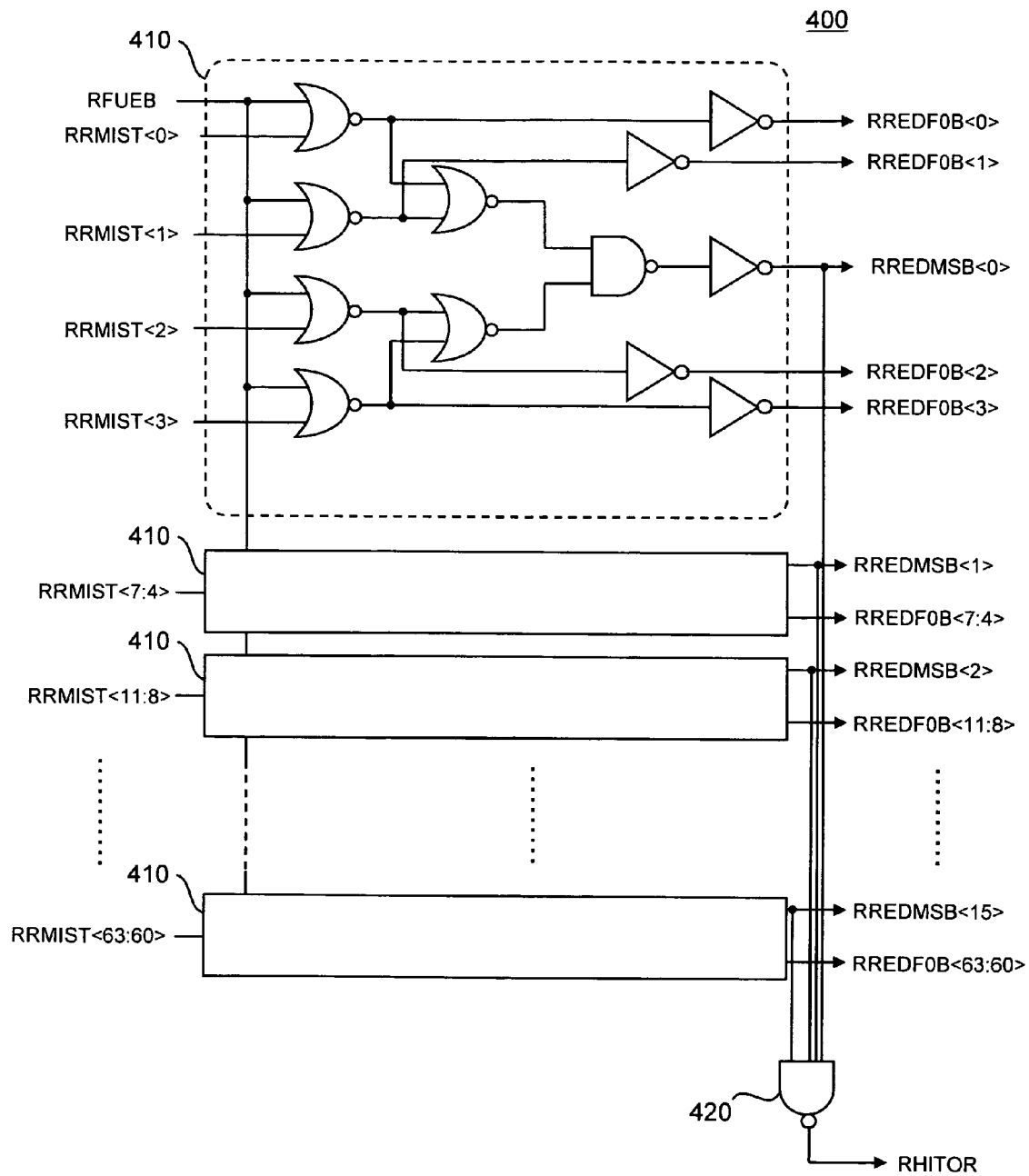
FIG. 7 is a circuit diagram of the repair address decoder 400.

FIG. 7 is a circuit diagram of the repair address decoder 400.

As shown in FIG. 7, the repair address decoder 400 includes 16 control circuits 410 each of which receives the corresponding 4-bit misfit signal RRMIST, and a NAND circuit 420 that generates a hit signal RHITOR.

In response to the mishit signal RRMIST, each control circuit 410 generates corresponding 4-bit repair addresses RREDF0B and 1-bit repair address RREDMSB. Among these, each repair address RREDF0B (64 bits in all) is supplied to the array control circuit 600 shown in FIG. 2, and the repair address RREDMSB (16 bits in all) is supplied to the main word driver 500 and the array control circuit 600 shown in FIG. 2.

Further, the repair address RREDMSB is supplied also to the NAND circuit 420. The NAND circuit 420 is a circuit that activates the hit signal RHITOR to a high level when any one of the 16-bit repair addresses RREDMSB is activated. That is, the hit signal RHITOR is activated when any one of the fuse sets 310 included in the repair determining circuit 300 detects a match.

The hit signal RHITOR, together with the repair address RREDMSB, is supplied to the main word driver 500 and the array control circuit 600, and used as a cancel signal for canceling access to the normal memory cell.

The main word driver 500 is explained next. In the main word driver 500, a plurality of two types of main word drivers MWDs and MWDRs are included, respectively.

Figure 8:
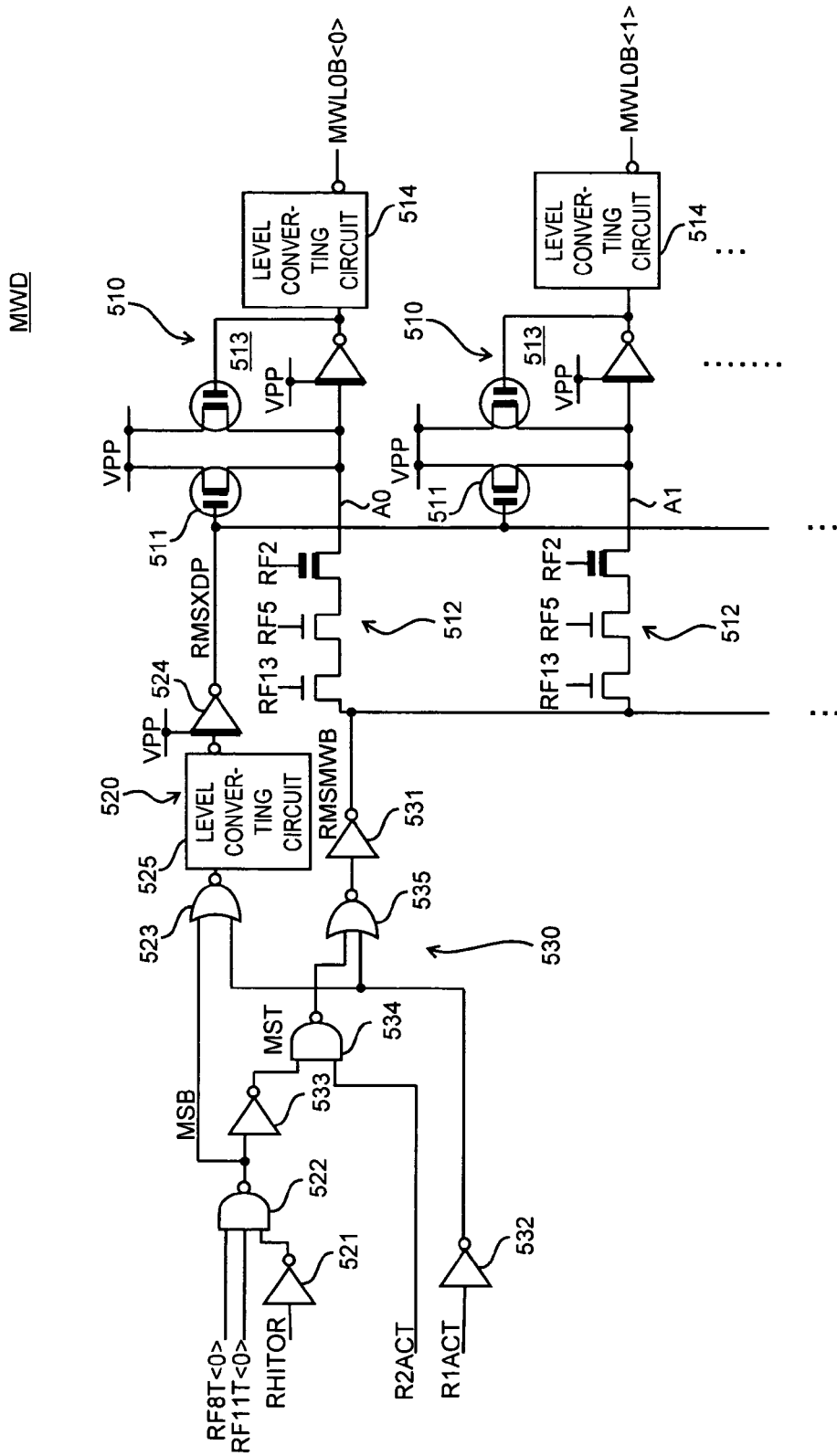
FIG. 8 is a circuit diagram of the main word driver MWD included in the main word driver 500.

FIG. 8 is a circuit diagram of the main word driver MWD included in the main word driver 500.

The main word driver MWD is a circuit that accesses to the normal memory cell MC, and includes a plurality of driver circuits 510, a precharge control circuit 520 that determines precharge timings of nodes A0, A1, . . . , and a discharge control circuit 530 that determines discharge timings of the nodes A0, A1, . . . , as shown in FIG. 8.

The driver circuits 510 are circuits each driving the corresponding main word lines MWLOB<0>, <1>, . . . based on levels of the nodes A0, A1, . . . , and is configured by a precharge transistor 511 connected between a power supply potential VPP and the nodes A0, A1, . . . , a discharge path 512 connected in series to the nodes A0, A1, . . . , a latch circuit 513 that maintains precharge states of the nodes A0, A1, . . . , and a level converting circuit 514 that level-converts output of the latch circuit 513.

A gate electrode of the precharge transistor 511 is supplied with an output signal RMSXDP of the precharge control circuit 520, and when the output signal RMSXDP becomes a low level, the nodes A0, A1, . . . are precharged to the power supply potential VPP. The discharge path 512 is constituted by three transistors connected in series to the nodes A0, A1, . . . , and gate electrodes thereof are supplied with one bit of the predecode signal RF2T, one bit of the predecode signal RF5T, and one bit of the predecode signal RF13T, respectively. The combination of the predecode signals RF2T, RF5T, and RF13T supplied to the discharge path 512 differs depending on each driver circuit 510, and when the bits corresponding to the predecode signals RF2T, RF5T, and RF13T are all at a high level, the discharge path 512 becomes conductive.

The level converting circuit 514 is a circuit that converts a potential on a low side from a VSS level (ground level) to a VKK level (<VSS). Accordingly, the main word lines MWLOB<0>, <1>, . . . driven by the main word driver MWD are transitioned between the VKK level and the VPP level.

On the other hand, the precharge control circuit 520 is configured by a plurality of logical circuits 521 to 524 and a level converting circuit 525. The logical circuits 521 to 524 controls the precharge transistor 511 based on one bit of the predecode signal RF8T, one bit of the predecode signal RF11T, the hit signal RHITOR, and the timing signal R1ACT. Among these, the logical circuits 521 to 523 are operated by a normal power supply (VDD), while the logical circuit 524 is operated by a boosted power supply VPP. Accordingly, the level converting circuit 525 converts the signal level between the logical circuits 523 and 524.

The combination of the predecode signals RF8T and RF11T supplied to the precharge control circuit 520 differs depending on each main word driver MWD, and when both of the bits corresponding to the predecode signals RF8T and RF11T are at a high level, the precharge of the nodes A0, A1, . . . is stopped in response to the activation of the timing signal R1ACT. When the hit signal RHITOR is activated, the precharge operation is resumed irrespective of the predecode signals RF8T and RF11T.

The discharge control circuit 530 is configured by an inverter 531 connected to the discharge path 512 and a plurality of logical circuits 532 to 535 that control the inverter 531. The discharge control circuit 530 is supplied with timing signals R1ACT and R2ACT, and when both of the bits corresponding to the predecode signals RF8T and RF11T are at a high level, sets output of the inverter 531 to a low level and permits the discharge of the nodes A0, A1, . . . in response to the activation of the timing signal R2ACT. However, when the hit signal RHITOR is activated, the output of the inverter 531 is at a high level irrespective of the predecode signals RF8T and RF11T, and the discharge of the nodes A0, A1, . . . is prohibited.

By such a circuit configuration, the main word driver MWD can activate the predetermined main word lines MWL0B<0>, <1>, . . . , corresponding to the row address RADT. When the hit signal RHITOR is activated by the detection of the defective address, it becomes possible to stop the selection operation of the main word lines MWL0B<0>, <1>, . . . to reset all the main word lines MWL0B<0>, <1> . . . to an inactivated state. In other words, at a stage before the level of the hit signal RHITOR is finalized, the driver circuit 510 activates the main word lines MWL0B<0>, <1>, . . . , irrespective of whether the row address RADT is a defective address.

As described above, in the main word driver 500, such a main word driver MWD is provided in plural.

Figure 9:
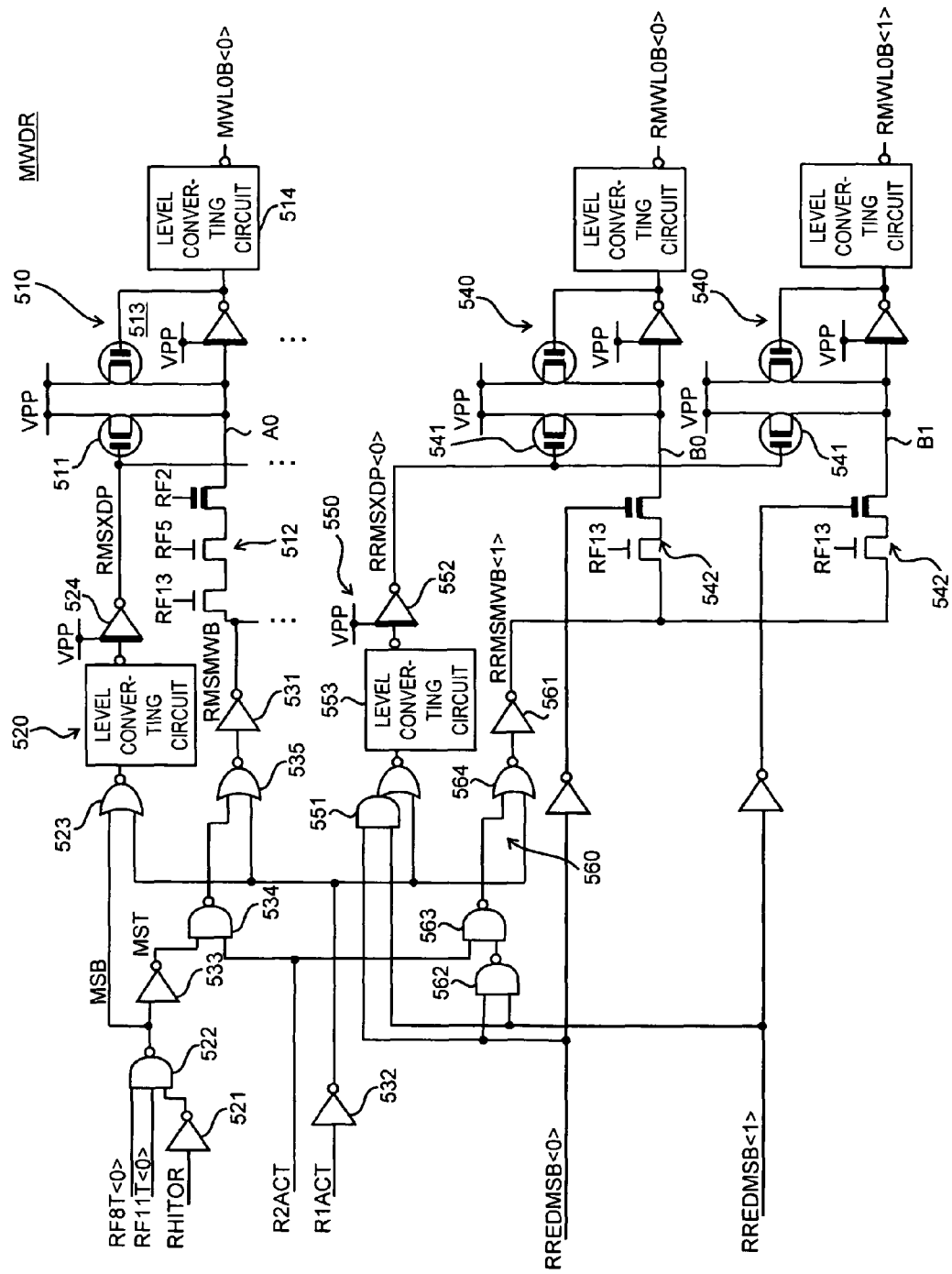
FIG. 9 is a circuit diagram of the main word driver MWDR included in the main word driver 500.

FIG. 9 is a circuit diagram of the main word driver MWDR included in the main word driver 500.

The main word driver MWDR is a circuit that accesses the normal memory cell MC or the redundant memory cell RMC, and has a configuration in which two driver circuits 540, a precharge control circuit 550 that determines precharge timings of the nodes B0 and B1, and a discharge control circuit 560 that determines discharge timings of the nodes B0 and B1 are added, as shown in FIG. 9. The rest of the configuration is the same as that of the main word driver MWD shown in FIG. 8, and thus the same parts are designated by the same reference numerals and redundant explanations will be omitted.

The driver circuit 540 is a circuit that drives the corresponding redundant main-word lines RMWL0B<0> and <1> based on levels of the nodes B0 and B1, respectively. The driver circuit 540 has a circuit configuration similar to that of the driver circuit 510 shown in FIG. 8 except that a discharge path 542 is configured by two transistors. To one of the transistors configuring the discharge path 542, an inverted signal of the repair address RREDMSB, which is output of the repair address decoder 400, is supplied.

The precharge control circuit 550 is configured by a plurality of logical circuits 551 and 552, and a level converting circuit 553. The logical circuits 551 and 552 control the precharge transistor 541 based on the repair address RREDMSB and the timing signal R1ACT. The repair address RREDMSB is a low-active signal, and is at a high level at a normal time. When any one of the repair addresses RREDMSB is changed to a low level by the detection of the defective address, the precharges of the nodes B0 and B1 are stopped in response to the activation of the timing signal R1ACT.

The discharge control circuit 560 is configured by an inverter 561 connected to the discharge path 542 and a plurality of logical circuits 562 to 564 that control the inverter 561. The discharge control circuit 560 is supplied with the timing signals R1ACT and R2ACT and the repair address RREDMSB, and when any one of the repair addresses RREDMSB is at a low level, sets the output of the inverter 561 to a low level in response to the activation of the timing signal R2ACT to permit the discharge of the nodes B0 and B1.

By such a circuit configuration, in addition to the function of the main word driver MWD shown in FIG. 8, the main word driver MWDR becomes to be imparted with a function of activating the predetermined redundant main-word lines RMWL0B<0> and <1> when a defective address is detected. Thus, when the row address RADT is a defective address, the driver circuit 540 activates the redundant main-word lines RMWL0B<0> and <1>.

As described above, in the main word driver 500, such a main word driver MWDR is provided in plural.

The array control circuit 600 is explained next. In the array control circuit 600, two types of control circuits ARAC and ARACR are each included in plural.

Figure 10:
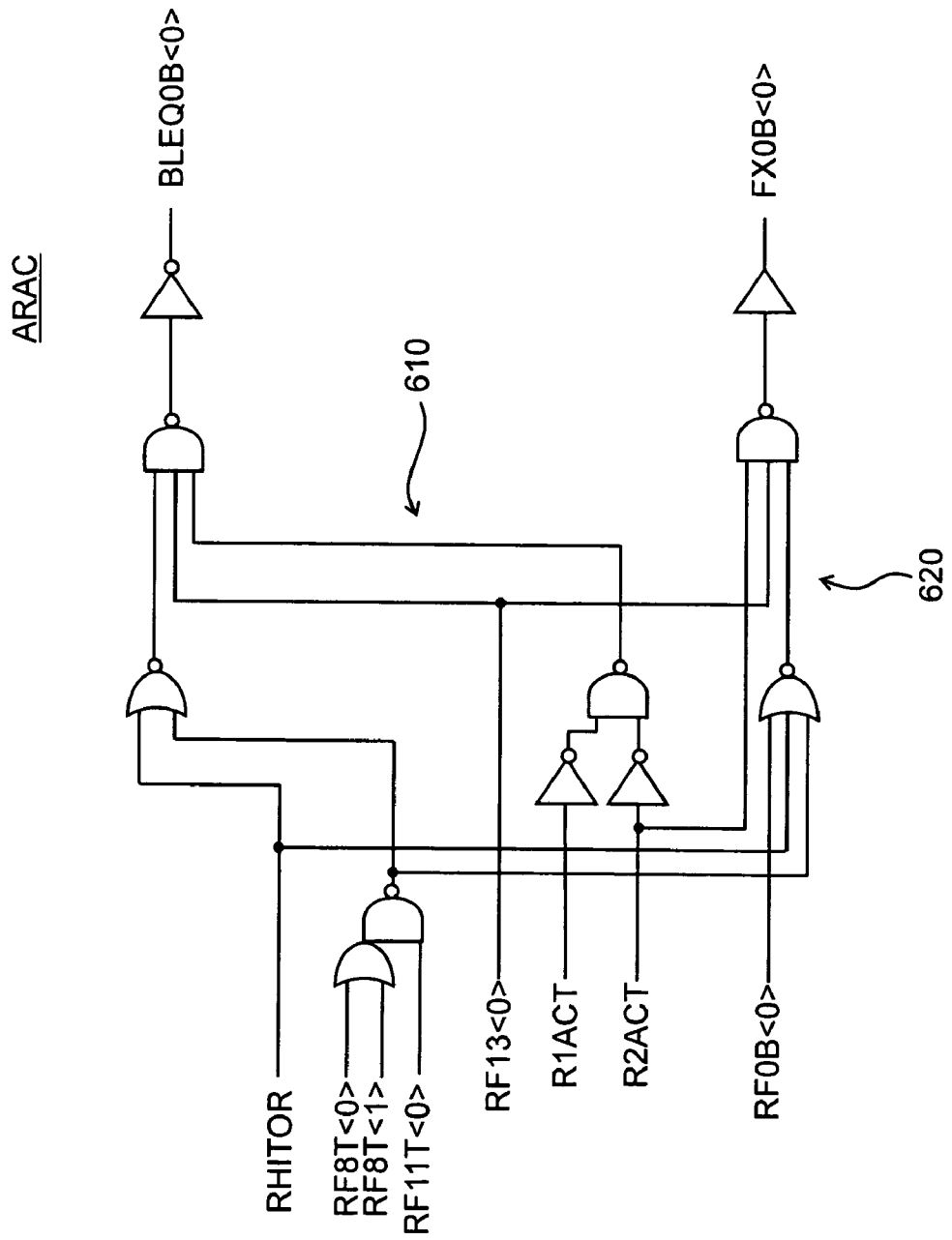
FIG. 10 is a circuit diagram of a control circuit ARAC included in the array control circuit 600.

FIG. 10 is a circuit diagram of a control circuit ARAC included in the array control circuit 600.

As shown in FIG. 10, the control circuit ARAC is configured by an equalize control circuit 610 that generates an equalize signal BLEQ0B and a sub-word control circuit 620 that generates a sub-word line selection signal FX0B. The equalize control circuit 610 and the sub-word control circuit 620 are both configured by a plurality of logical circuits.

The equalize control circuit 610 generates the equalize signal BLEQ0B based on two bits of the predecode signal RF8T, one bit of the predecode signal RF11T, one bit of the predecode signal RF13T, the hit signal RHITOR, and the timing signals R1ACT and R2ACT. The combination of the predecode signals RF8T, RF11T, and RF13T supplied to the equalize control circuit 610 differs depending on each control circuit ARAC, and when the signals match a predetermined combination, the equalize signal BLEQ0B is inactivated to a high level. When the hit signal RHITOR is activated, the equalize signal BLEQ0B is at a low level (active) irrespective of the predecode signals RF8T, RF11T, and RF13T.

The sub-word control circuit 620 generates a sub-word line selection signal FX0B based on one bit of the predecode signal RF0B, two bits of the predecode signal RF8T, one bit of the predecode signal RF11T, one bit of the predecode signal RF13T, the hit signal RHITOR, and the timing signal R2ACT. The combination of the predecode signals RF0B, RF8T, RF11T, and RF13T supplied to the sub-word control circuit 620 also differs depending on each control circuit ARAC, and when the predecode signals match a predetermined combination, the sub-word line selection signal FX0B is activated to a low level. When the hit signal RHITOR is activated, the sub-word line selection signal FX0B is at a high level (inactive) irrespective of the predecode signals RF0B, RF8T, RF11T, and RF13T.

Figure 11:
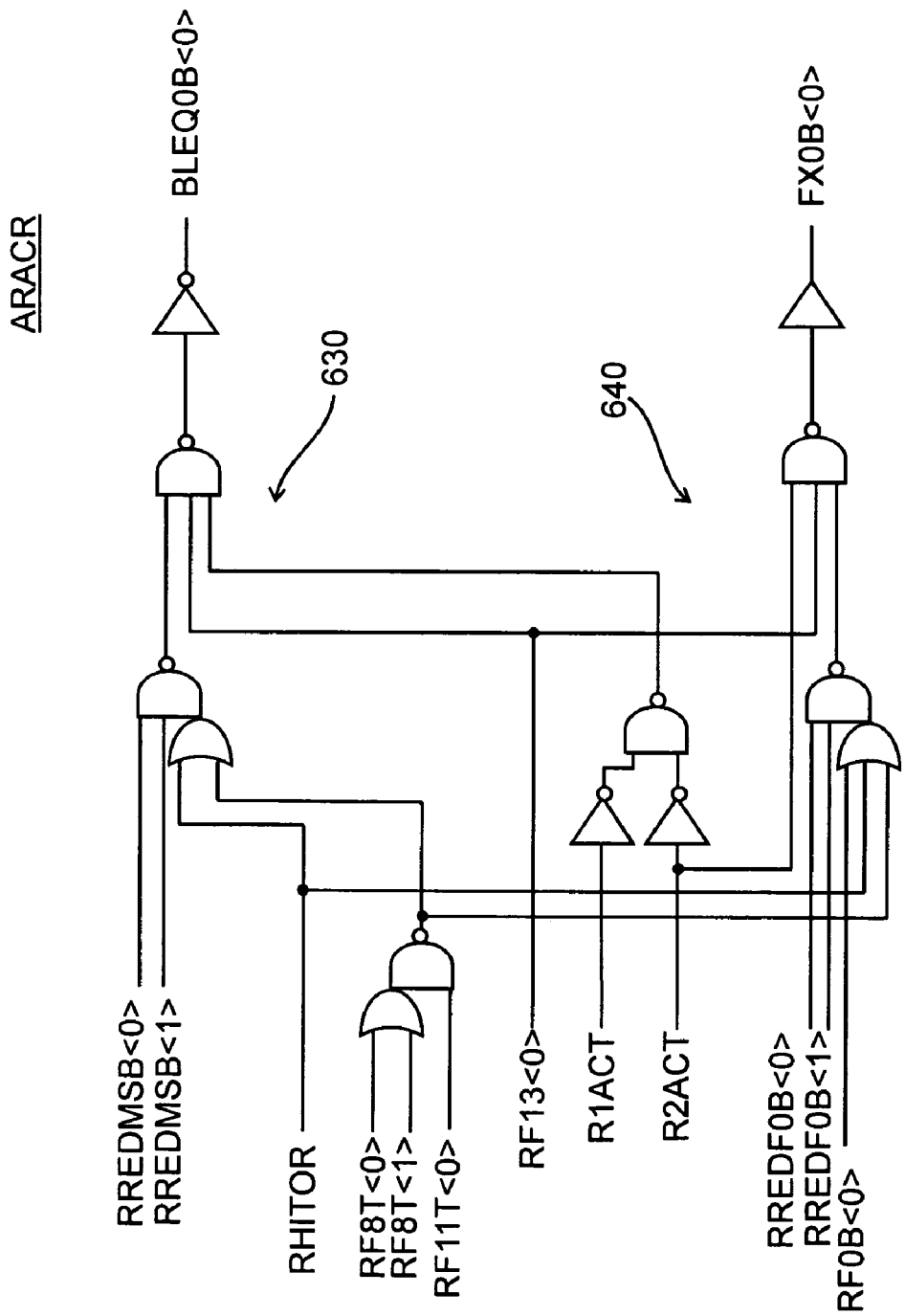
FIG. 11 is a circuit diagram of a control circuit ARACR included in the array control circuit 600.

FIG. 11 is a circuit diagram of a control circuit ARACR included in the array control circuit 600.

As shown in FIG. 11, the control circuit ARACR is configured by an equalize control circuit 630 that generates an equalize signal BLEQ0B and a sub-word control circuit 640 that generates a sub-word line selection signal FX0B. The equalize control circuit 630 and the sub-word control circuit 640 are both configured by a plurality of logical circuits.

The equalize control circuit 630 is similar to the equalize control circuit 610 shown in FIG. 10, however, differs in that it generates the equalize signal BLEQ0B additionally based on the repair address RREDMSB. By the circuit configuration shown in FIG. 11, the equalize control circuit 630 inactivates the equalize signal BLEQ0B to a high level not only when the predecode signals RF8T, RF11T, and RF13T match a predetermined combination but also when the repair address RREDMSB is activated.

The sub-word control circuit 640 is also similar to the sub-word control circuit 620 shown in FIG. 10, however, differs in that it generates the sub-word line selection signal FX0B additionally based on the repair address RREDF0B. By the circuit configuration shown in FIG. 11, the sub-word control circuit 640 activates the sub-word line selection signal FX0B to a low level not only when the predecode signals RF0B, RF8T, RF11T, and RF13T match a predetermined combination, but also when the repair address RREDF0B is activated.

Various signals generated by the main word driver 500 and the array control circuit 600 are supplied to the memory cell array 700 shown in FIG. 2. In the memory cell array 700, a plurality of sub-word drivers SWD and SWDR that drive the sub-word line SWL and the redundant sub-word line RSWL, respectively, and a plurality of sense amplifiers SA connected to the bit line BL are arranged. At a crosspoint between the sub-word line SWL and the bit line BL, the normal memory cell MC is arranged, and at a crosspoint between the redundant sub-word line RSWL and the bit line BL, the redundant memory cell RMC is arranged. Although not shown, in the actual memory cell array 700, the redundant bit line or the like are also arranged.

Figure 12:
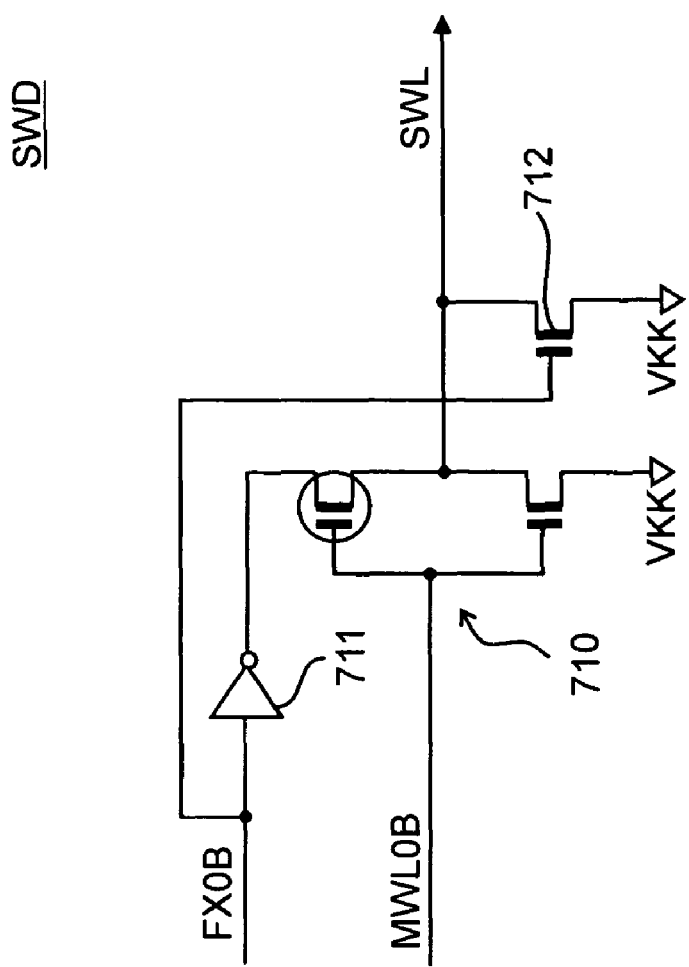
FIG. 12 is a circuit diagram of the sub-word driver SWD.

FIG. 12 is a circuit diagram of the sub-word driver SWD.

As shown in FIG. 12, the sub-word driver SWD is configured by an inverter 710 that inverts the level of the main word line MWL0B, an inverter 711 that supplies voltage to the inverter 710 based on the sub-word line selection signal FX0B, and a reset transistor 712 that resets the sub-word line SWL based on the sub-word line selection signal FX0B. By such a configuration, both the main word line MWL0B and the sub-word line selection signal FX0B are activated to a low level, the corresponding sub-word line SWL is driven to a high level. In other cases, the corresponding sub-word line SWL is fixed to a low level.

Figure 13:
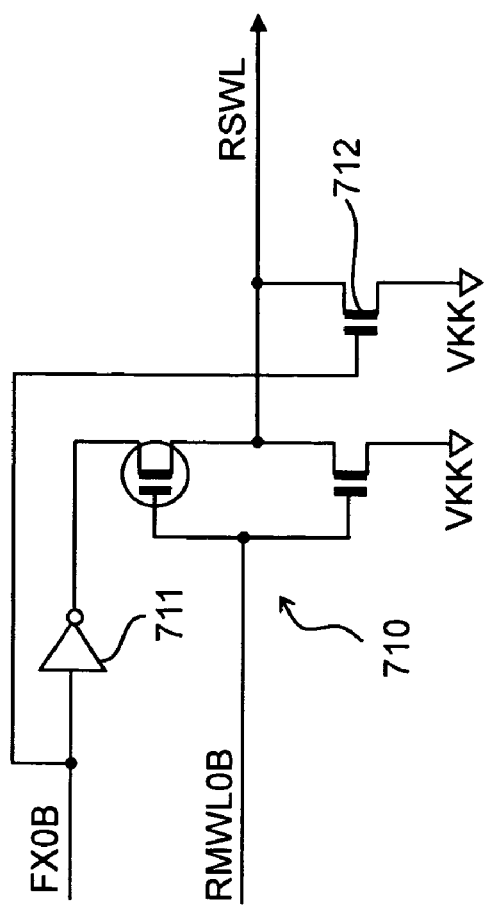
FIG. 13 is a circuit diagram of the sub-word driver SWDR.

FIG. 13 is a circuit diagram of the sub-word driver SWDR. As shown in FIG. 13, the sub-word driver SWDR has the same circuit configuration as that of the sub-word driver SWD shown in FIG. 12 except that a redundant main-word line RMWL0B and a redundant sub-word line RSWL are used instead of the main word line MWL0B and the sub-word line SWL.

Figure 14:
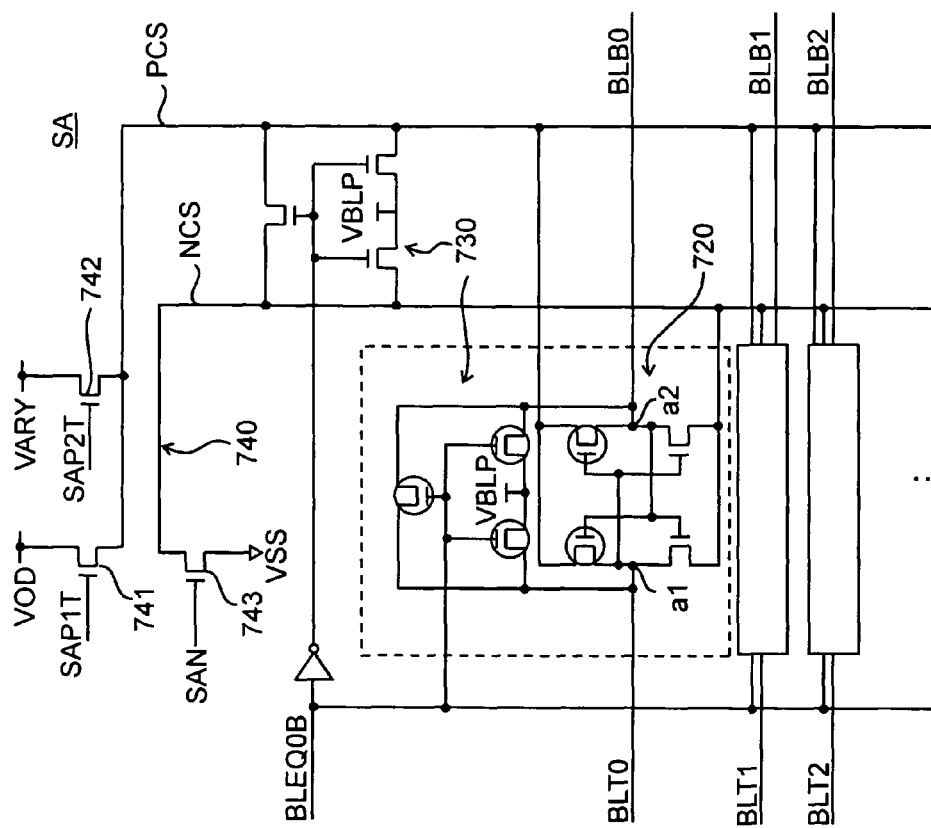
FIG. 14 is a circuit diagram of the sense amplifier SA.

FIG. 14 is a circuit diagram of the sense amplifier SA.

As shown in FIG. 14, the sense amplifier SA includes a sense circuit unit 720 connected to bit-line pairs BLT and BLB, an equalize circuit 730 that equalizes the sense circuit unit 720, and a driver circuit 740 that drives the sense circuit unit 720, and serves a role for amplifying data of the accessed normal memory cell MC or redundant memory cell RMC.

The sense circuit unit 720 is a cross-coupled flip-flop circuit of which the one input/output node a1 is connected to a bit line BLT and of which the other input/output node a2 is connected to a bit line BLB. The equalize circuit 730 is a circuit that is activated in response to the equalize signal BLEQ0B. When the equalize signal BLEQ0B is at a low level, the equalize circuit 730 equalizes the input/output nodes a1 and a2 of the sense circuit unit 720 to the same potential VBLP. At this time, wirings PCS and NCS that supply an operation voltage to the sense circuit unit 720 are also equalized to the same potential.

The driver circuit 740 is a circuit that supplies an operation voltage to the sense circuit unit 720 via the wirings PCS and NCS, and is configured by transistors 741 and 742 connected to the wiring PCS and a transistor 743 connected to the wiring NCS.

The transistor 741 is a transistor that supplies an overdrive potential VOD (>VARY) to the wiring PCS in response to the timing signal SAP1T, and is turned on in an initial stage of a sense operation. The transistor 742 is a transistor that supplies an array potential VARY (high-side potential of the memory cell) to the wiring PCS in response to the timing signal SAP2T, and is turned on after the end of the overdrive by the transistor 741. The transistor 743 is a transistor that supplies a ground potential VSS (low-side potential of the memory cell) to the wiring NCS in response to the timing signal SAN, and is turned on all the time during the sense operation. As described above, the timing signals SAP1T, SAP2T, and SAN configure the sense-amplifier operation signal SAT shown in FIG. 2 and FIG. 4.

When the equalize circuit 730 is in an inactivated state and the driver circuit 740 is in an activated state by such a circuit configuration, data reading and writing to and from the memory cells MC and RMC via the bit-line pairs BLT and BLB become possible.

Figure 15:
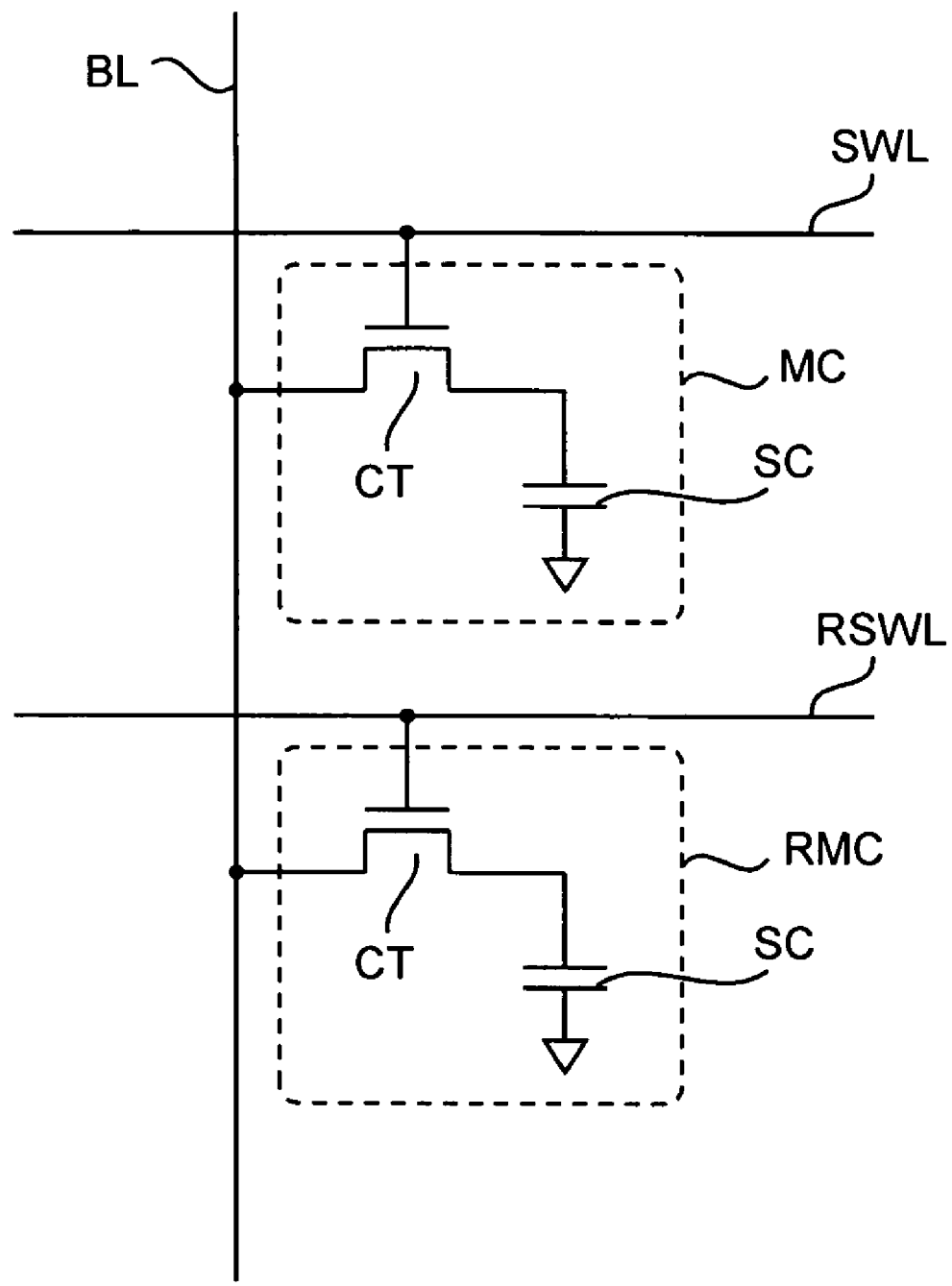
FIG. 15 is a circuit diagram of the normal memory cell MC and the redundant memory cell RMC.

FIG. 15 is a circuit diagram of the normal memory cell MC and the redundant memory cell RMC.

As shown in FIG. 15, the normal memory cell MC and the redundant memory cell RMC have the same circuit configuration, and both are configured by a cell transistor CT and a storage capacitor SC connected in series to the bit line BL (BLT or BLB). In the normal memory cell MC, a gate electrode of the cell transistor CT is connected to the sub-word line SWL, and in the redundant memory cell RMC, a gate electrode of the cell transistor CT is connected to the redundant sub-word line RSWL. By such a configuration, when the sub-word line SWL or the redundant sub-word line RSWL is activated, the corresponding cell transistor CT is turned on, and the storage capacitor SC is connected to the bit line BL. Thereby, it becomes possible to transmit and receive charge via the bit line BL.

Thus, the circuit configuration of the semiconductor memory device is described. By such a circuit configuration, at a stage before the level of the hit signal RHITOR is finalized, the sub-word driver SWD can execute an access operation to the normal memory cell irrespective of whether the row address RADT is a defective address. When the row address RADT is a defective address, the sub-word driver SWDR can execute an access operation to the redundant memory cell.

An operation of the semiconductor memory device 10 is explained next.

Figure 16:
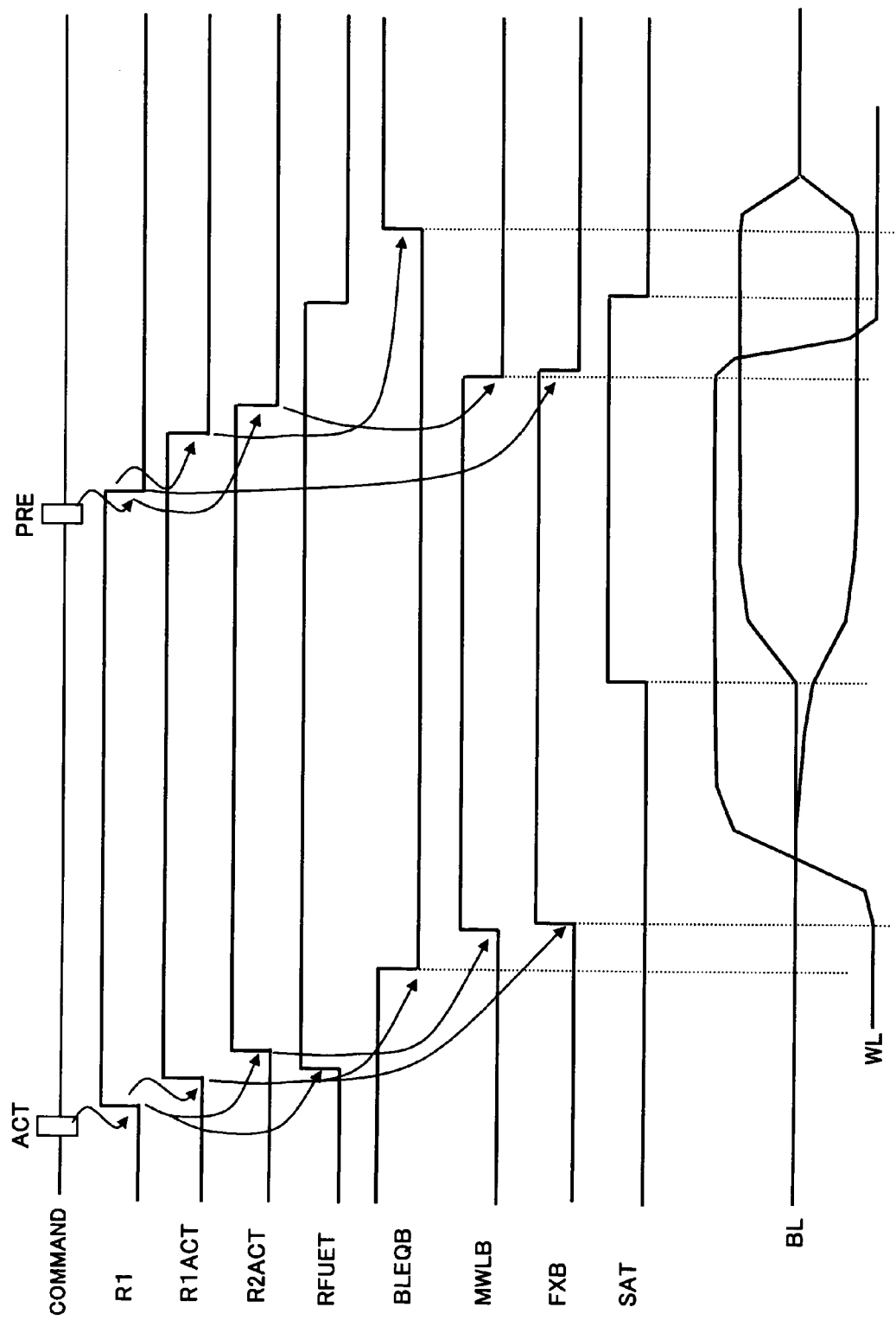
FIG. 16 is a waveform chart for explaining a basic operation of the row system circuits in the semiconductor memory device 10.

FIG. 16 is a waveform chart for explaining a basic operation of the row system circuits in the semiconductor memory device 10.

As shown in FIG. 16, when the active command (ACT) is issued, the timing signal R1 is activated by the address latch circuit 30, and in response thereto, the timing signals R1ACT and R2ACT are activated in this order by the signal control circuit 200. Thereby, the main word drivers MWD and MWDR and the control circuits ARAC and ARACR operate in synchronism with the timing signals R1ACT and R2ACT, and thus the equalize signal BLEQB is inactivated and the main word line MWLB and the sub-word line selection signal FXB are activated. In response to the activation of the timing signal R1, the fuse enable signal RFUET is also activated.

As a result, the word line WL designated by the row address RADT is raised, and thereby, a potential difference occurs in the bit line pair BL. After a certain amount of potential difference occurs in the bit line pair BL, the sense-amplifier operation signal SAT is activated. As a result, the sense amplifier SA is activated, and the bit line pair BL is fully swung. Thereafter, a read operation or a write operation is executed under control of a column system circuit (not shown).

When the read operation or the write operation is completed and the precharge command (PRE) is issued, the timing signal R1 is inactivated, and in response thereto, the timing signals R1ACT and R2ACT are inactivated in this order. Thereby, the main word line MWLB and the sub-word line selection signal FXB are reset, and the sense amplifier SA is also inactivated. The equalize signal BLEQB is activated, and the bit line is in a precharge state. Further, the fuse enable signal RFUET is also inactivated.

Figure 17:
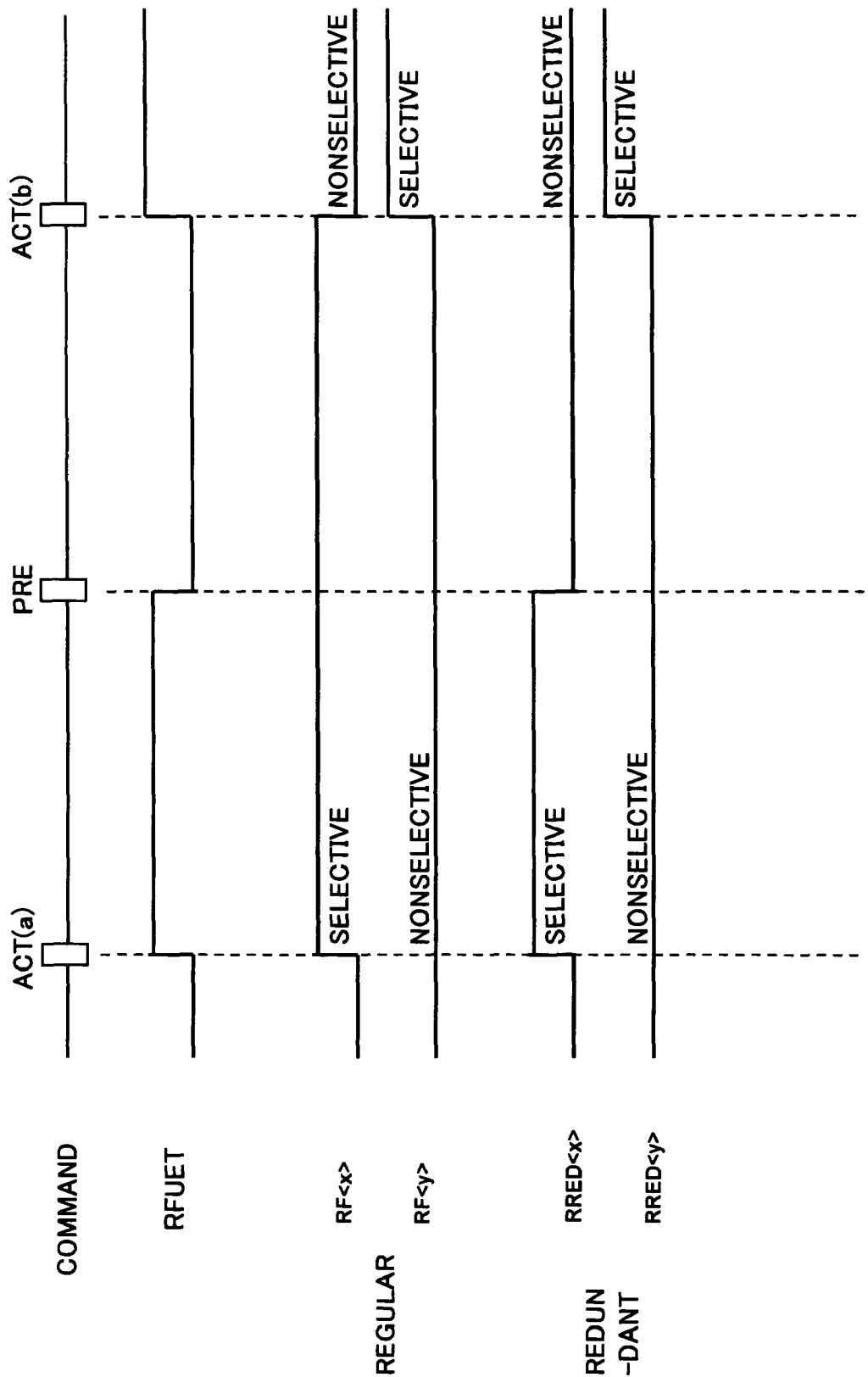
FIG. 17 is a schematic timing chart showing a relationship between a fuse enable signal RFUET, a predecode signal, and a repair address.

As described above, when the fuse enable signal RFUET is inactivated, the mishit signals RRMIST are all at a high level. Thus, the repair addresses that are outputs of the repair address decoder 400 are all reset. In contrast, the fuse enable signal RFUET is not supplied to the row predecoder 100, and thus the predecode signal is not reset and the prior logical level is maintained. FIG. 17 is a timing chart for explaining these processes. FIG. 17 is a schematic timing chart for explaining to which command each signal is responded and transitioned, and the transition timing of each signal does not strictly depict the actual timing.

Writing of RF<x> in FIG. 17 is a predecode signal activated by the row address RADT corresponding to the active command ACT(a), and writing of RF<y> is a predecode signal activated by the row address RADT corresponding to the active command ACT(b). Writing of RRED<x> is a repair address activated by the row address RADT corresponding to the active command ACT(a), and writing of RRED<y> is a repair address activated by the row address RADT corresponding to the active command ACT(b).

As shown in FIG. 17, when a first active command ACT(a) is issued, the predecode signal RF<x> and the repair address RRED<x> are selected in response thereto. Needless to say, the repair address RRED<x> is selected only in a case of hit, and there is no selected repair address in a case of mishit. Thereafter, when the precharge command (PRE) is issued, the repair address RRED<x> is reset while the predecode signal RF<x> is not reset, and the selected state is maintained as it is.

Subsequently, when a second active command ACT (b) is issued, the predecode signal RF<y> and the repair address RRED<y> are selected in response thereto. The repair address RRED<y> is selected only in a case of hit, and there is no selected repair address in a case of mishit.

At this time, when the repair address RRED<y> is finalized, the transition is performed at a high speed. The reason for this is that the prior repair address RRED<x> is reset in response to the precharge command (PRE), and thus a transition delay resulting from coupling does not occur. In contrast, the transition of the predecode signal RF<y> is slower than the transition of the repair address. The reason for this is that the prior predecode signal RF<x> is not reset, and thus a signal transition takes time due to coupling.

However, finalizing of the repair address RRED<y>, which requires to wait for determination by the repair determining circuit 300, is slower than the finalizing of the predecode signal RF<y> in the first place. That is, there is a difference in signal propagation rate between a "regular path" using the predecode signal RF and a "redundant path" using the repair address RRED, and generally, the row system access is rate-controlled by the redundant path. In the present embodiment, such a propagation rate difference is utilized and the configuration in which the predecode signal is not reset in the high-speed regular path is adopted. This prevents an increase in power consumption resulting from resetting of the predecode signal without substantially decreasing the access rate. That is, when the transition of the predecode signal RF<y> is at the same speed to or faster than the transition of the repair address RRED<y>, a decrease in access rate does not occur.

In the present invention, it is not essential that the transition of the predecode signal RF<y> is at the same speed to or faster than the transition of the repair address RRED<y>. The transition of the predecode signal RF<y> can be slower. In this case, the access rate is decreased slightly. However, a considerable decrease does not appear. Accordingly, the signal control circuit 200 can be so designed that the timing signals R1ACT and R2ACT are activated where a slower transition, that is, either one of the transition of the transition predecode signal RF<y> or the repair address RRED<y> of the predecode signal based on the input of the row address, is used as a reference.

To suppress a decrease in transition rate of the predecode signal RF, a plurality of signal wirings through which the predecode signal RF is transmitted are preferably in a twist structure.

Figure 18:
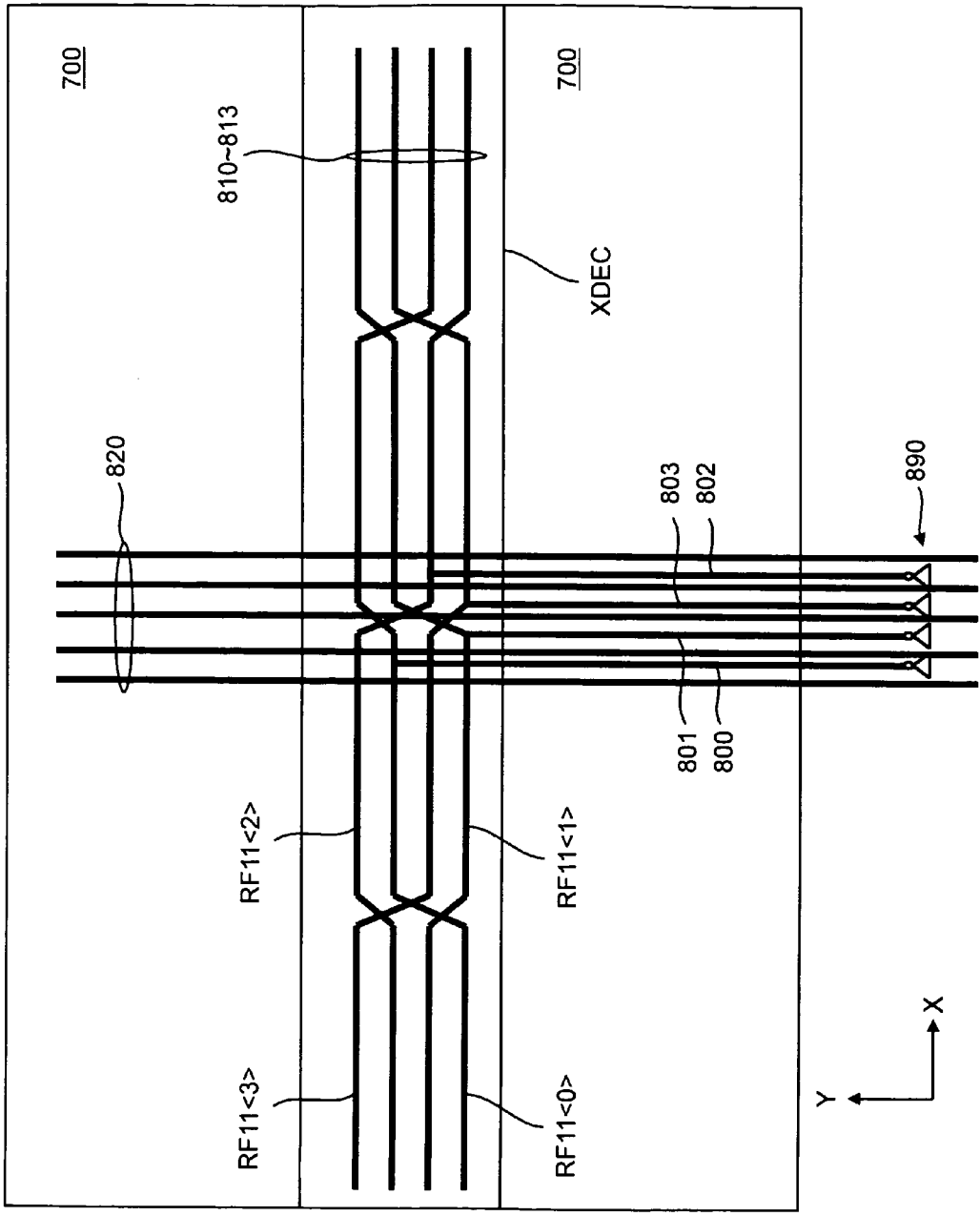
FIG. 18 is a schematic plane view showing a wiring structure of the predecode signal RF11T<3:0>.

FIG. 18 is a schematic plane view showing a wiring structure of the predecode signal RF11T<3:0>.

In an example shown in FIG. 18, a memory cell array 700 is divided in two by an X decoder region XDEC. The X decoder region XDEC is a region in which the main word drivers MWD and MWDR, and the control circuits ARAC and ARACR are arranged. The predecode signal RF11T<3:0> is supplied by driving of a driver 890 in the final stage to the X decoder region XDEC via four signal wirings 800 to 803 extending in a Y direction from the row predecoder 100, and also distributed to each circuit within the X decoder region XDEC via four signal wirings 810 to 813 extending in an X direction. For the four signal wirings 800 to 803 extending in the Y direction, a third-layer aluminum wiring can be used, for example. For the four signal wirings 810 to 813 extending in the X direction, a second-layer aluminum wiring can be used, for example.

As shown in FIG. 18, the four signal wirings 800 to 803 extending in the Y direction are all sandwiched by a shield power supply wiring 820. That is, the shield power supply wiring 820 is always present between the signal wirings. The shield power supply wiring 820 uses the same wiring layer (for example, a third-layer aluminum wiring) as those of the signal wirings 800 to 803. Thereby, coupling between the signal wirings 800 to 803 is decreased, and thus a decrease in signal transition rate is suppressed.

The four signal wirings 810 to 813 extending in the X direction have a twist structure in which adjacent signal wirings are switched with one another. Thereby, the adjacent signal wirings are not fixed over an entire length of the X decoder region XDEC, and thus coupling is decreased, suppressing the decrease in signal transition rate.

With reference to FIG. 18, an explanation has been given of an example of the signal wirings through which the predecode signal RF11T<3:0> is transmitted is the twist structure, and the shield structure is arranged between the wirings. Preferably, other predecode signals (RF0B<3:0>, RF2T<7:0>, RF5T<7:0>, RF8T<7:0>, and RF13T<1:0>) are structured similarly.

It is apparent that the present invention is not limited to the above embodiments, but may be modified and changed without departing from the scope and spirit of the invention.

In the above embodiment, the present invention is applied to the DRAM as an example. However, an application target of the present invention is not limited thereto, and the present invention can be also applied to other types of semiconductor memory devices such as a flash memory, a phase change memory (PRAM), and a variable resistance memory (RRAM).

What is claimed is:

1. A semiconductor memory device comprising:
a memory cell array having a normal memory cell and a redundant memory cell that is used to replace the normal memory cell when it is defective;
a predecoder generating a predecode signal by predecoding a row address supplied in synchronism with an active command;
a repair determining circuit determining whether the row address is a defective address;
a repair address decoder generating a repair address when the repair determining circuit detects that the row address is a defective address;
a word driver selecting a word line corresponding to the normal memory cell based on the predecode signal when the repair determining circuit detects that the row address is not a defective address, and selecting a word line corresponding to the redundant memory cell based on the repair address when the repair determining circuit detects that the row address is a defective address; and
a signal control circuit resetting the repair address without resetting the predecode signal, in response to issuance of a precharge command.

2. The semiconductor memory device as claimed in claim 1, further comprising a plurality of signal wirings for transmitting the predecode signal, the signal wirings having a twist structure in which the signal wirings adjacent to each other are switched to one another.

3. The semiconductor memory device as claimed in claim 2, further comprising a shield power supply wiring arranged between the signal wirings.

4. The semiconductor memory device as claimed in claim 1, wherein
the signal control circuit generates a timing signal which controls a start timing of the word driver, and
the timing signal is activated based on a slower transition timing of either the predecode signal or the repair address after the row address is supplied.

5. A semiconductor memory device comprising:
a memory cell array having a normal memory cell and a redundant memory cell that is used to replace the normal memory cell when it is defective;
a word driver selecting a predetermined word line within the memory cell array based on a row address supplied in synchronism with an active command, and canceling selection of the word line in response to a precharge command; and a signal control circuit resetting a repair address generated when the row address indicates the normal memory cell that is defective, without resetting a predecode signal generated by predecoding the row address, in response to issuance of the precharge command.

6. The semiconductor memory device as claimed in claim 5, further comprising a plurality of signal wirings for transmitting the predecode signal, the signal wirings having a twist structure in which the signal wirings adjacent to each other are switched to one another.

7. The semiconductor memory device as claimed in claim 6, further comprising a shield power supply wiring arranged between the signal wirings.

8. A control method of a semiconductor memory device, the semiconductor memory device including a memory cell array having a normal memory cell and a redundant memory cell that is used to replace the normal memory cell when it is defective, the control method of the semiconductor memory device comprising:

selecting a predetermined word line within the memory cell array based on a row address supplied in synchronism with an active command;

canceling selection of the word line in response to a precharge command;

generating a predecode signal by predecoding the row address;

determining whether the row address is a defective address;

generating a repair address in response to a fact that the row address is a defective address;

selecting a word line corresponding to the normal memory cell based on the predecode signal in response to a fact that the row address is not the defective address;

selecting a word line corresponding to the redundant memory cell based on the repair address in response to a fact that the row address is a defective address; and resetting the repair address without resetting the predecode signal, in response to issuance of the precharge command.

* * * * *